United States Patent [19]

Rheinfelder

[11] 4,023,104

[45] May 10, 1977

[54] SYSTEM FOR ESTABLISHING SIGNAL LEVEL FOR TRANSMISSION OF A CATV CABLE

[75] Inventor: William A. Rheinfelder, Phoenix, Ariz.

[73] Assignee: Alpha Engineering Corporation, Phoenix, Ariz.

[22] Filed: Aug. 8, 1975

[21] Appl. No.: 602,967

[52] U.S. Cl. .............................. 325/308; 325/133; 358/86; 358/139
[51] Int. Cl.² .......................................... H04B 3/56
[58] Field of Search ............ 325/63, 133, 134, 308, 325/31, 363, 398, 399, 401, 67; 178/DIG. 4, DIG. 13; 324/115; 340/177 CA; 358/86, 139

[56] References Cited

UNITED STATES PATENTS

| 3,469,190 | 9/1969 | Rheinfelder | 178/DIG. 4 |
| 3,543,163 | 11/1970 | Rheinfelder | 325/308 |
| 3,578,898 | 5/1971 | Kuzminsky | 325/308 |
| 3,886,457 | 5/1975 | Petaja | 178/DIG. 13 |
| 3,908,165 | 9/1975 | Cauldwell | 325/67 |

Primary Examiner—Howard W. Britton
Assistant Examiner—Jin F. Ng
Attorney, Agent, or Firm—Cahill, Sutton & Thomas

[57] ABSTRACT

A system is provided incorporating a combining network for receiving television signals corresponding to the different television channels and for combining these signals for transmission over a cable. A plurality of input circuits is connected to the combining network, each circuit receiving a television signal of a different channel. Each input circuit includes a diode network for deriving a DC voltage level proportional to the television signal applied thereto. A calibration resistor is connected in series with the diode network and provides a means for connection to a meter for indicating a relative signal level. The combining network output is connected through an attenuator, a coupler and a power inserter to an amplifier, the output of which provides an appropriately amplified combined signal for application to a CATV trunk line.

7 Claims, 2 Drawing Figures

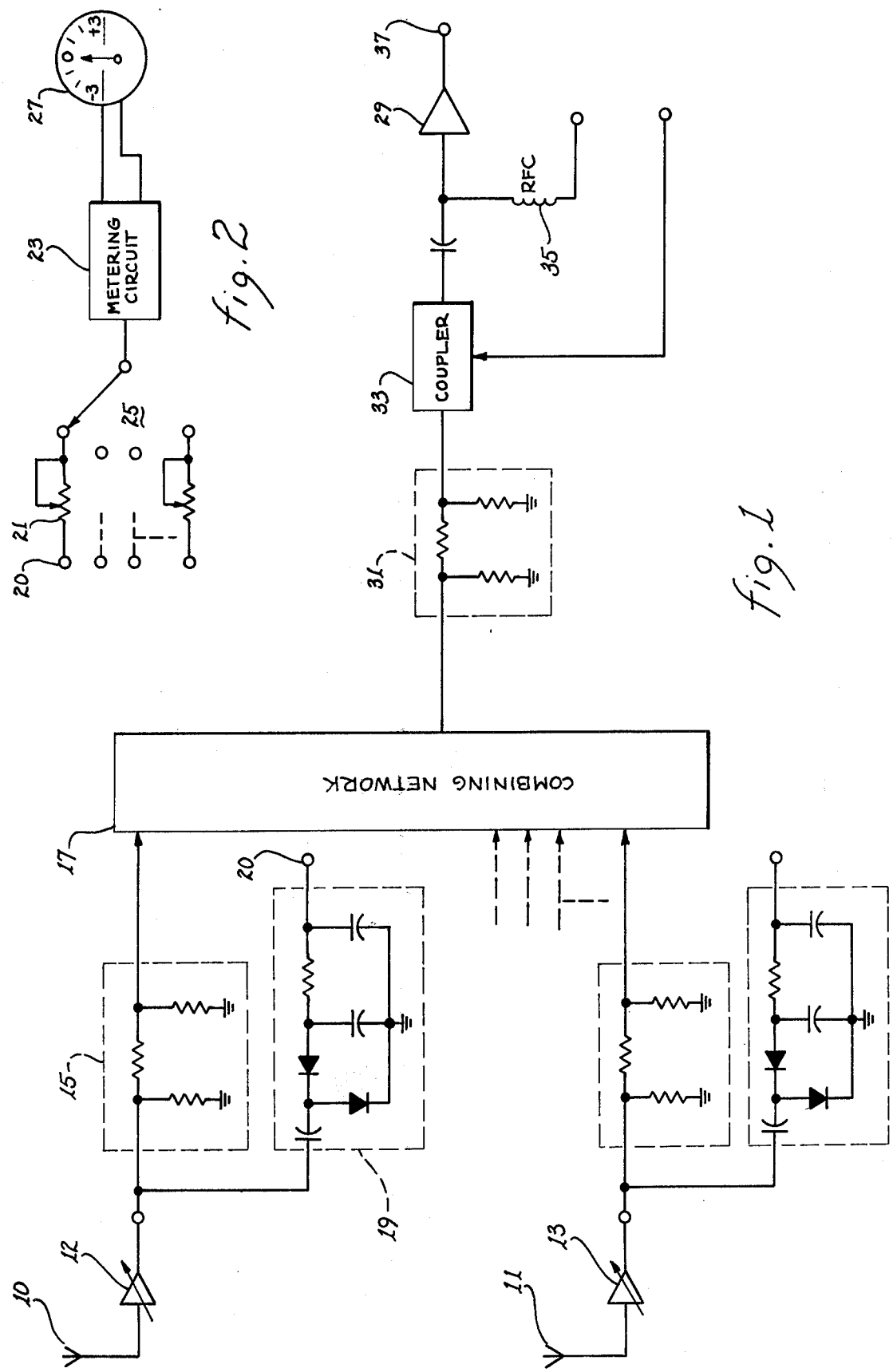

SYSTEM FOR ESTABLISHING SIGNAL LEVEL FOR TRANSMISSION OF A CATV CABLE

The present invention pertains to CATV systems, and more particularly to a system used in the head end of a CATV system for deriving signals of appropriate levels for transmission over a CATV trunk line.

Typical CATV systems include an antenna array appropriately positioned with respect to the various television channels to receive the television signals being transmitted by the transmitting stations. The signals received by the respective antenna are appropriately amplified through well known preamplifying techniques and applied to a combining network. The combining network combines the television signals of the different channels for application to a CATV trunk line. The equipment found at the described portion of the CATV system is usually referred to as "head end" equipment.

The transmission requirements of the television signals at the different channel frequencies dictates that signal levels be at predetermined levels for each of the channels. Since the attenuation at the frequencies of the different channels will vary during the transmission over the television cable, the amplification afforded to the respective channel frequencies differs. A more complete discussion of the requirements of the respective channel signals and signal levels may be found in CATV CIRCUIT ENGINEERING by William Rheinfelder, 1975 .

When the head end equipment is installed, or the equipment is subsequently altered or modified to accommodate system changes or expansion, the levels applied to the trunk cable must be checked and adjusted. Prior art techniques for accomplishing such adjustments incorporated the use of fieldstrength meters combined with the provision of test points in the head end equipment. Alternatively, the cable to which the amplified and combined signals are applied is disconnected and the signal level measured at that point. Fieldstrength meters inherently exhibit a plus or minus 2 dB error while the above-described test procedures generally incorporate an additional dB error; as a result of these inherent errors, it is very difficult and sometimes impossible to accurately adjust the head end equipment to provide signal levels accurately calibrated for application to the television cable.

It is therefore an object of the present invention to provide an improved system for receiving, combining and amplifying television signals for application to a CATV transmission cable.

It is another object of the present invention to provide an improved system for receiving, combining and amplifying television signals wherein a plurality of input circuits are interposed between a combining network and the preamplifiers of each of the television channels.

It is still another object of the present invention to provide an improved system for receiving, combining and amplifying television signals wherein each channel is provided with a diode network for deriving a DC voltage level proportional to each television channel signal to permit efficient calibration of the signal level at the output of the system.

It is yet another object of the present invention to provide an improved system for receiving, combining and amplifying television signals wherein the television channel signals are each attenuated prior to being combined in a combining network and wherein the combined signal derived from the combining network is amplified for application to a CATV cable.

It is still another object of the present invention to provide an improved system for receiving, combining and amplifying television signals wherein input signal level from each television channel may readily be adjusted to provide a proper amplified signal level at the output of the system for application to a CATV cable.

These and other objects of the present invention will become apparent to those skilled in the art as the description thereof proceeds.

Briefly, in accordance with the embodiment chosen for illustration, each of the television signals corresponding to a television channel is amplified through a typical preamplifier having an adjustable gain. The signal derived from the preamplifier is applied to an input circuit incorporating an attenuator to reduce the signal level to thereby keep distortion low in a combining network connected to the attenuator. A level detector is connected to the high level side of the attenuator and is used to derive a DC voltage level proportional to the television signal level for that channel applied to the attenuator.

The output of the combining network is supplied to a CATV amplifier through an optional attenuator, coupler and power inserter arrangement. A plurality of calibration resistors are each connected to a different one of the level detectors and a meter is provided for selectively connecting to each of the calibration resistors. The equipment thus described is calibrated prior to installation, each channel at a time, by measuring the signal level at each channel frequency, at the output of the CATV amplifier and adjusting the gain of the preamplifier at the input of the system for that frequency until the desired output level is obtained. The meter is switched to the corresponding calibration resistor and the resistor adjusted to provide a predetermined meter deflection when the desired output level for that channel is achieved.

Each channel signal level is thus calibrated and may subsequently be checked while the system is in operation by merely connecting the meter to the desired calibration resistor for the channel under investigation and observing the deflection of the meter.

The present invention may more readily be described by reference to the accompanying drawings in which FIG. 1 is a schematic diagram, partially in functional block form, of a portion of the system of the present invention.

FIG. 2 is a schematic diagram, partly in functional block diagram, of the remaining portion of the system of the present invention.

Referring now to the drawings, television signals corresponding to the various channels may be received by one or a plurality of antenna such as those shown at 10 and 11. For convenience it will be assumed that each antenna is intended to receive the television signal of a single channel. As mentioned above, the received signal which is typically amplified is a preamplifying system which is schematically illustrated in the drawings as adjustable gain amplifiers 12 and 13. For convenience only two channels are shown; it will be understood that the system of the present invention incorporates identical elements for each of the channels. The signal received by the antenna 10, for example, is preamplified and applied through an attenuator 15 to a combining network 17. Combining networks are well known to the cable television industry and the specific network utilized in the present invention is not critical. Thus, the combining network may take one of several forms, one of which is described on page 175, et seq. of the above-described publication. The attenuator 15 reduces the level of the signal applied to the combining network 17 to minimize distortion in the combining network.

The signal from the preamplifier 12 is also applied to a level detector 19; the level detector 19 comprises a diode network which receives the television signal for that channel and produces a DC voltage level proportional to the television signal level. The level detector output terminal 20 is shown in FIG. 1 and separately again in FIG. 2 for convenience of description; it being understood that the two terminals may coincide but are shown to permit ready description of meter switching. The level detector 19 is connected in series with a calibration resistor 21 for reasons to be described more fully hereinafter. The calibration resistor 21 is switchably connectable to a metering circuit 23 through a switch 25. The metering circuit 23 provides an appropriate output for application to a meter 27. The metering circuit 23 may be a conventional off-the-shelf circuit such as a 741 Op Amp available from sources such as Motorola, Fairchild, etc. The metering circuit usually provides a high input impedance to minimize the effect of the circuit on the measurement being made.

The signals applied to the combining network 17 are combined into a single television signal appropriate for application to a CATV cable. This combined signal from the combining network 17 may be applied directly to a CATV amplifier 29 or may be optionally applied to the amplifier 29 through one or more additional elements. For example, in the embodiment chosen for illustration, an attenuator 31 receives the combined signal from the combining network 17 to reduce the combined signal level. A coupler 33, preferably a directional coupler, is provided to permit the injection of pilot frequencies that may be used for control in the CATV system. These pilot frequencies do not correspond to any of the channel frequencies but nevertheless fall within the frequency bandwidth of the television channels; typically, such pilot frequencies may be 200 MHz.

The system chosen for illustration also incorporates a power inserter which takes the form of an rf choke 35 that may be used to insert a relatively low frequency power signal (typically 60 Hz) for providing power to repeater amplifiers located on the television cable. The amplifier 29 may be a standard CATV amplifier such as that described in my co-pending application Ser. No. 553,924 filed Feb. 28, 1975, or, alternatively, could be a typical prior art CATV amplifier such as an Anaconda 8840. The output of the amplifier 29 is applied to a CATV cable shown schematically at 37 for transmission throughout the CATV system.

To facilitate the description of the use of the present system, typical signal levels and channel frequencies will be used. A common desired level, at Channel 13, to be provided by the system at the cable 37 is +32 dBmV. Amplifier 29 will typically have a gain of 22 dBmV at Channel 13 so that an input level applied to the amplifier 29 should be 10 dBmV. With a nominal loss of 5 dBmV for the combined attenuator 31, coupler 33 and power inserter 35, the signal provided by the combining network 17 should be 15 dBmV. Since the combining network 17 will usually have a nominal loss of 15 dB at the channel 13 frequency and the attenuator 15 will have a 20 dB loss, the Channel 13 signal supplied by the preamplifier 12 would require a level of 50 dBmV. Unfortunately, the nominal level of 50 dBmV may vary as much as plus or minus 3 dBmV to produce an exact +32 dBmV at the input to the cable 37. To permit the adjustment of the level of the input signal applied to the attenuator 15, a precision meter may be used to measure the signal level at Channel 13 at the input to the cable 37; the gain of the preamplifier 12 may be adjusted to provide the exact desire 32 dBmV at the Channel 13 frequency. The required input signal level generates a DC voltage level in the level detector 19 which is applied through the calibration resistor 21 and metering circuit 23 to the meter 27. The calibration resistor 21 is then adjusted to provide, for example, a midscale deflection of the meter 27 (which may be calibrated in plus and minus dB levels). The next input television channel signal is then measured in an identical manner and adjusted by adjusting the gain of the corresponding preamplifier; further, the calibration resistor is adjusted to again provide a midscale meter defection. These steps are repeated for each of the incoming channel frequencies.

When the CATV system head end is in operation, the signal levels applied to the cable transmitting the signals to the remainder of the CATV system may conveniently be adjusted to bring them to the desired level by simply adjusting the gain of the respective preamplifiers. The measurement of the signal using the system of the present invention avoids the difficulties of measuring and calibration systems of the prior art. For example, the level of the input signal for any channel frequency may be substantially different from the above-mentioned nominal +50 dBmV since the exact input signal level is immaterial. All that is necessary is that the input signal level be adjusted to provide a midscale deflection of the meter 27 which will automatically provide a precise +32 dBmV level at the Channel 13 frequency at the cable. The measurement by the meter 27 is substantially independent of the various channel frequencies and is precise without regard to errors inherent in the components of the system between the preamplifiers and the cable. The diodes of the diode networks operates at relatively high signal levels and are therefore not significantly affected by temperature, or other environmental variations; further, no frequency selective networks or selective amplifiers are needed since the measurement of signal level is performed before the signals are combined.

Since the measurement of signal level is a DC measurement and is a midscale measurement, meter and supply power errors have little effect on the overall system accuracy. The described system is capable of an accuracy of better than 0.1 dB and is equal to the accuracy of the precision laboratory instrument used for original calibration of the system at the factory.

I claim:

1. In a system for receiving, combining and amplifying television signals for transmission on CATV system cables, said system including adjustable gain preamplifying means for each television channel, the improvement comprising:

a. a combining network for receiving, at inputs thereof, and combining a plurality of television signals each having a frequency corresponding to a different television channel, and for providing a combined signal at an output thereof;
b. a plurality of input circuits connected to receive television signals of different channels, each connected to a different input of said combining network, each input circuit having circuit means connected thereto comprising:
  i. means for deriving a DC voltage level proportional to a TV signal applied thereto;
  ii. a calibration resistor in series with said means for deriving a DC voltage level;
c. meter means selectively connectable to each of said calibration resistors for measuring the level of a television signal at one of said input circuits;
d. amplifying means for receiving said combined signal and providing an amplified combined signal for transmission on a CATV cable;
e. means connecting the output of said combining network to said amplifying means; and
f. each of said calibration resistors having a value to provide a predetermined meter deflection when a television signal of a different one of said channels is at a desired level.

2. The improvement defined in claim 1, wherein said plurality of input circuits each include an attenuator in series with said combining network for attenuating television signals applied to said combining network.

3. The improvement defined in claim 1, wherein said means for deriving a DC voltage level comprises a diode network.

4. The improvement defined in claim 1, wherein said means connecting the output of said combining network to said amplifying means includes an attenuator.

5. The improvement defined in claim 4, wherein said means connecting the output of said combining network to said amplifying means also includes a directional coupler.

6. In a system for receiving, combining and amplifying television signals for transmission on CATV system cables, said system including adjustable gain preamplifying means for each television channel, the improvement comprising:
a. a combining network for receiving, at inputs thereof, and combining a plurality of television signals each having a frequency corresponding to a different television channel, and for providing a combined signal at an output thereof;
b. a plurality of input circuits connected to receive television signals of different channels, each connected to a different input of said combining network, each input circuit including
  i. an attenuator connected to receive a preamplified television signal and connected to supply the attenuated preamplified signal to said combining network;
  ii. a diode network connected to receive said preamplified television signal for deriving a DC voltage level proportional thereof;
  iii. a calibration resistor connected in series with said diode network;
c. meter means selectively connectable to each of said calibration resistors for measuring the level of a television signal at one of said input circuits;
d. amplifying means for receiving said combined signal and providing an amplified combined signal for transmission on a CATV cable;
e. an attenuator and a directional coupler connected in series with each other to form a series circuit; said series circuit connecting the output of said combining network to said amplifying means; and
f. each of said calibration resistors having a value to provide a predetermined meter deflection when a television signal of a different one of said channels is at a desired level.

7. The improvement defined in claim 6, wherein said amplifying means comprises a broadband CATV amplifier.

* * * * *